United States Patent [19]

Fossel

[11] Patent Number: 5,261,405
[45] Date of Patent: Nov. 16, 1993

[54] APPARATUS AND METHOD FOR DETECTING CANCER USING NUCLEAR MAGNETIC RESONANCE

[75] Inventor: Eric T. Fossel, Chestnut Hill, Mass.

[73] Assignee: The Beth Israel Hospital Association, Boston, Mass.

[21] Appl. No.: 934,299

[22] Filed: Aug. 24, 1992

Related U.S. Application Data

[60] Continuation of Ser. No. 418,182, Oct. 6, 1989, abandoned, which is a continuation-in-part of Ser. No. 325,773, Mar. 20, 1989, abandoned, which is a continuation of Ser. No. 262,073, Oct. 24, 1988, abandoned, which is a continuation of Ser. No. 188,752, Apr. 29, 1988, abandoned, which is a continuation of Ser. No. 36,943, Apr. 10, 1987, abandoned, which is a division of Ser. No. 833,840, Feb. 26, 1986, abandoned.

[51] Int. Cl.$^5$ ............................................. A61B 5/055
[52] U.S. Cl. ................................. 128/653.2; 324/312; 436/64; 436/71; 436/173
[58] Field of Search ...................... 128/653.1; 324/307, 324/308, 312; 436/173, 64, 71

[56] References Cited

U.S. PATENT DOCUMENTS

| | | | |
|---|---|---|---|
| 3,327,117 | 6/1967 | Kamentsky | 250/83.3 |
| 3,420,634 | 1/1969 | Godsey | 436/173 X |
| 3,789,832 | 2/1974 | Damadian | 128/653 |
| 4,115,062 | 9/1978 | Morre et al. | 23/230 |
| 4,354,499 | 10/1982 | Damadian | 128/653 |
| 4,390,633 | 6/1983 | Merilan et al. | 436/173 X |
| 4,411,270 | 10/1983 | Damadian | 128/653 |
| 4,452,250 | 6/1984 | Chance | 128/653 |
| 4,516,074 | 5/1985 | Sugimoto | 324/309 |
| 4,521,733 | 6/1985 | Bottomley et al. | 324/309 |
| 4,608,991 | 9/1986 | Rollwitz | 128/653 |
| 4,918,021 | 4/1990 | Fossel | 128/653 X |

OTHER PUBLICATIONS

Shulman, "NMR-Another Cancer Test Disappointment" New England Journal of Medicine, vol. 322, No. 14, Apr. 5, 1990, pp. 1002-1003.
Science News, vol. 137, p. 236, Apr. 14, 1990, "NMR Test Fails to Identify Cancer".
Wilding et al., "Assessment of Proton Nuclear Magnetic Resonance Spectroscopy for Detection of Malignancy," 34 Clinical Chemistry No. 3, 505-11 (1988).
Floyd et al., "Time Course of Tissue Water Proton Spin-Lattice Relaxation in Mice Developing Ascites Tumors," 34 Cancer Research 89-91 (Jan. 1974).
Hazlewood et al., "Relationship Between Hydration and Proton Nuclear Magnetic Resonance Relaxation Times in Tissues of Tumor-bearing and Non-Tumor-Bearing Mice: Implications for Cancer Detection," 52 J. of Nat'l Cancer Inst. No. 6, 1849-53 (Jun. 1974).

(List continued on next page.)

Primary Examiner—Ruth S. Smith
Attorney, Agent, or Firm—Lorusso & Loud

[57] ABSTRACT

A technique and an apparatus are disclosed for the detection of cancer using nuclear magnetic resonance (NMR). Specifically, NMR parameters for protons of lipid methyl and/or methylene groups are determined and compared against a corresponding value for healthy patients. In the preferred embodiments, an improved NMR spectrometer is employed to provide a spectrum for non-water components of blood, blood serum or blood plasma and the width of the methyl and/or methylene groups is automatically measured at half-height as a determination of spin-spin relaxation time ($T_2$) which is the parameter used for purposes of comparison with healthy controls. Suppression of the water proton signal is employed where necessary in order to obtain a suitable spectrum for the non-water component protons. In the event that a positive reading is obtained, the level of plasma triglycerides is determined and if it is high, the patient's bodily fluid sample is further subjected to C-13 nuclear magnetic spectroscopy. The resonance line of the plasma C-13 spectra discriminates between true and false positive results from the proton NMR reading and determines the presence or absence of cancer in the patient.

10 Claims, 12 Drawing Sheets

OTHER PUBLICATIONS

McLachlan, "Cancer-Induced Decreases in Human Plasma Proton NMR Relaxation Rates," 25 *Phys. Med. Biol.* No. 2, 309-15 (1980).

Smith, et al., "Nuclear Magnetic Resonance Imaging of the Pancreas," 142 *Radiology* 677-80 (Mar. 1982).

Klimek et al., "A Discussion of Nuclear Magnetic Resonance (NMR) Relaxation Time of Tumors in Terms of Their Interpretation as Self-Organizing Dissipative Structures, and of Their Study in Vivo by NMR Zeugmatographic Imaging," 52 *Ginekol Pol.* No. 6, 493-502 (1981).

Beall et al., "The 'Systemic Effect' of Elevated Tissue and Serum Relaxation Times for Water in Animals and Humans with Cancers," 19 *NMR Basic Principles and Progress* 39-57 (1981).

Wieczorek et al., "Isolation and Characterization of an RNA-Proteolipid Complex Associated with the Malignant State in Humans," 82 *Proc. Nat'l Acad Sci. USA* 3455-59 (May 1985).

Mountford et al., 9 *J. Biochem. and Biophy, Meth.* 323-30 (1984).

Mountford et al., "Influenza Virus: An NMR Study of Mechanisms Involved in Infection," 720 *Biochem. Biophys. Acta* 65-74 (1982).

Chamberlain, *The Practice of NMR Spectroscopy* 13-14, Plenum Press, New York (1974).

Onsaka et al., "Detection by Proton Nuclear Magnetic Resonance of Elevated Lactate Concentrations in Serums From Patients with Malignant Tumors," 32 *Japan. J. Med. Sci. Biol.* 305-9 (1979).

Mountford et al., "High Resolution Proton Nuclear Magnetic Resonance: Application to the Study of Leukaemic Lymphocytes," 41 *Br. J. Cancer* 1000-1003 (1980).

Mountford et al., "High-Resolution Proton Nuclear Magnetic Resonance of Metastatic Cancer Cells," 226 *Science* 1415-17 (1984).

Damadian, "Tumor Detection by Nuclear Magnetic Resonance," 171 *Science* 1151-53 (1971). Damadian discloses background information on using NMR to detect malignancy.

Frey et al., 49 *J. Nat'l Cancer Inst.* 903 (1972).

Inch et al., 52 *J. Nat'l Cancer Inst.* 353 (1974).

Iijima et al., 5 *Physiol. Chem. and Physics* 431 (1973).

Taylor et al., "A Review of the Magnetic Resonance Response of Biological Tissue and Its Applicability to the Diagnosis of Cancer by NMR Radiology," 5 *Computed Tomography* 122-33 (1981).

Zimmerman et al., "Cerebral NMR: Diagnostic Evaluation of Brain Tumors by Partial Saturation Technique with Resistive NMR," 27 *Neuroradiology* 9-15 (1985).

Identification and Characterization of Tissues by $T_2$-Selective Whole-Body Proton NMR Imaging, Magnetic Resonance in Mecicine, vol. 2., No. 29, Gersonde et al 1985.

A Proteolipid in Cancer Cells . . . , *Chemical Abstracts*, vol. 105, No. 11, Sep., 1986, Wright et al p. 455, col. 2, Abstract No. 95403g; and FEBS Lett., vol. 203, No. 2, 1986 pp. 164-168 Wright et al. Jul. 1986.

Proton nuclear magnetic resonance . . . , *Anayltical Chemistry, Rabenstein et al, pp. 3178-3184: p. 3179, col. 2, paragraph 2, p. 3180, col. 1, paragraph 5, Dec. 1986.*

NMR relaxation in human blood serum . . . , *Database Biosis*, (Biol. Abstracts) Abstract 76019795, Rebokatov et al and Biofizika (USSR), vol. 27, No. 2, pp. 336-338, 1982.

Proton NMR relaxation in the peripheral blood . . . , *Database Biosis.* abstract No. 65047264, Ekstrand et al, and *Phy. Med. and Biol.*, vol. 22, No. 5, pp. 925-931, 1977.

Solvent Suppression in Fourier Transform Nuclear Magnetic Resonance, Hore, 55 *J. Magnetic Resonance* 283-300 (1983).

Holmes et al., "Hyperlipidemia as a Biochemical Basis of Magnetic Resonance Plasma Test for Cancer," 1 *NMR in Biomedicine* No. 1, 44-9 (1988).

Rabenstein et al., "Nuclear Magnetic Resonance Spectroscopy," 60 *Analytical Chemistry* No. 12, 1R-28R (Jun. 15, 1988).

Saunders et al., "A Detailed Assessment of the Recent MRS Blood Test for Cancer," Second European Conference/Congress of NMR in medicine and Biology, Berlin, Abstract 86 (Jun. 1988).

Letters to the editor, 316 *New Eng. J. Med.* No. 22, 1411-14 (May 28, 1987). (Authors are Parl et al., Ross et al., Small et al., Campbell et al., van Blitterswijk, and Mountford).

Dowd et al., "Detection of Malignant Tumors: Water-Suppressed Proton Nuclear Magnetic Resonance Spectroscopy of Plasma," 5 *Magnetic Resonance in Medicine*, No. 4, pp. 395-397 OCt. (1987).

Bruker, DISNMR Command Reference Manual, 1987.

Peeling et al., "$^1$H and $^{13}$C Nuclear Magnetic Resonance Studies of Plasma From Patients with Primary Intracranial Neoplasms," *Journal of Neurosurgery* (1988).

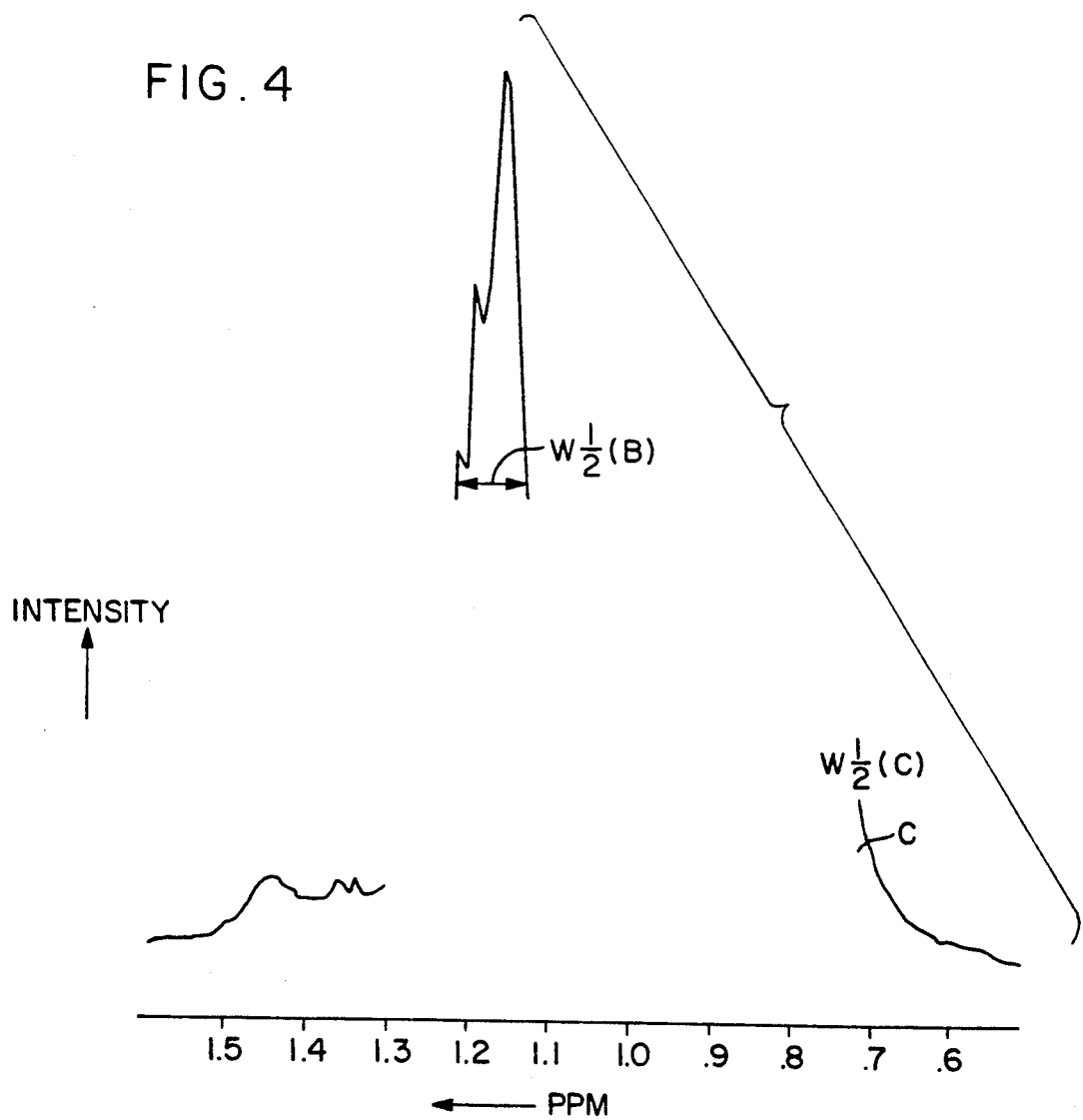

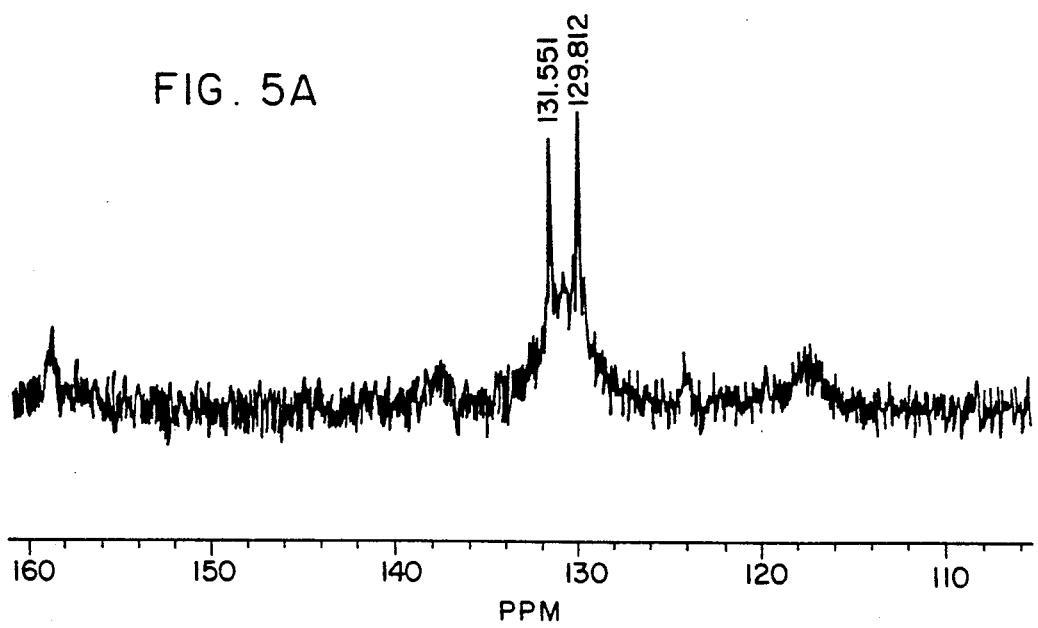
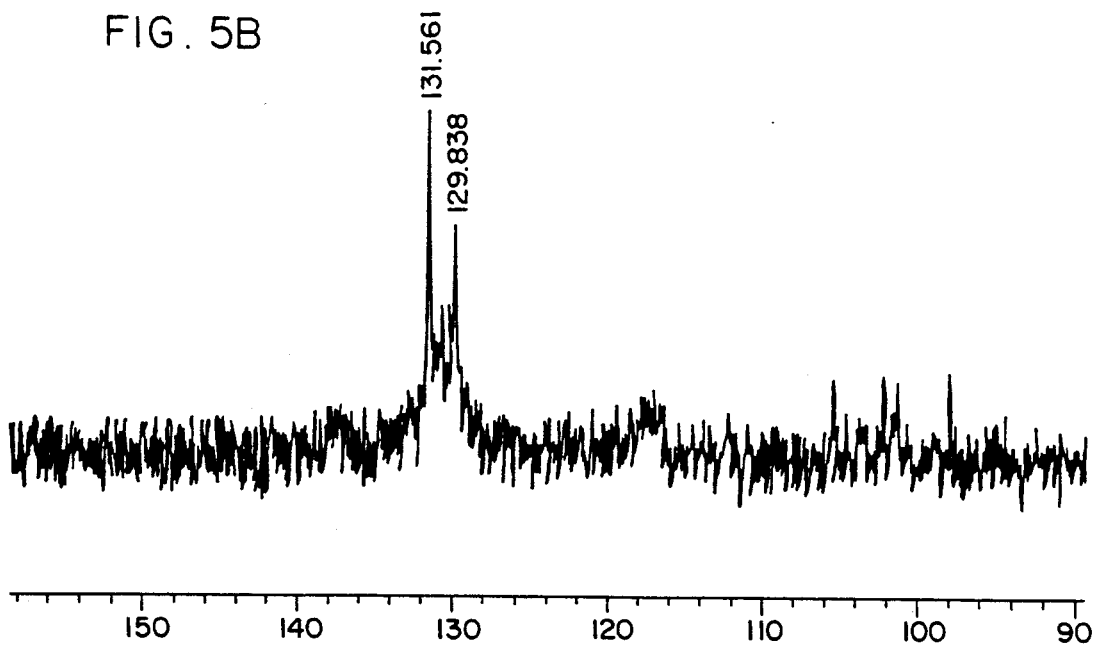

```
1   SX
2   RJ TUNE
3   II
44  D8
4   ZE
5   TU4
6   RJ FQSET
7   PJ FQSET
8   II
9   ZE
10  D1
11  P6:A
12  RGA=10
13  ZE
14  D1
15  P6:A
16  GO=14
17  FT
18  APK
19  PPD O2SET
20  PASC SETO2FRQ
21  O1CO
22  II
23  ZE
24  D6 S2 HG
25  P2:A
26  D7
27  P1:A D0
28  RGA=24
29  ZE
30  D6 S2 HG
31  P2:A
32  D7
33  P1:A D0
34  GO=30
35  WR #1
36  IF #1
37  LO TO 1 TIMES 120
38  EXIT
```

FIG. 10B

```
1   ZE
2   SX
3   RJ TUNE
4   II
5   D8
6   ZE
7   TU4
8   ZE
9   RJ FQSET
10  PJ FQSET
11  II
12  LOCK
13  GO=12
14  WR #1
15  IF #1
16  ZE
17  LO TO 1 TIMES 120
    EXIT
```

FIG. 10C

```
BB QN QP A3              DP =        5H           TD =          8K
AQ =    .1720320         SI =        8K           SF = 90.5646198
O1 =   2777.000          O2 =     6000.000        SW = 23809.524
HZ/PT =    5.813         FW =       29800         TE =        297
RD =   1.0000000         PW =        3.80         NS =          8
DS =           0         DW =          21         DE=       28.80
DR CURRENT = 12          SY=    67.0000000        PR =        L 2
RG =         320
NC =          -2         LB =         0.0         GB =        0.0
TM1 =          0         TM2 =          0         APKN =        0
F1[PPM]=  55.968                                       -23.942
HZ/CM=   361.85          PPM/CM=   F2[PPM]=       CX =     20.000
CY =         0.0         MAXX =    3.9955         MAXY =   15.000
SR =    4619.779         IS =         35          AZFW =      0.0H
AZFE =         0         ABSG=     5   1                ABSL=      3
FABE =         0         NOBC =        0          ISEN =      128
MI =      10.000         PC =      1.000          AI =          0
PCO =        0.0         PC1 =       0.0          QS    GAMMA =  0.0
ALPHA =      0.0         NZP =         0          SREP =B
```

FIG. 10D

```
DO QN QP A3            DP  =        7L           TD  =        8K
AQ  =    .5652480      SI  =        8K           SF  =360.1357816
O1  =   4800.000       O2  =     4752.665        SW  =   7246.377
HZ/PT =    1.769       FW  =      9100           TE  =      297
RD  =   1.0000000      PW  =        2.00         NS  =        0
DS  =           2      DW  =       69            DE=        88.80
DR CURRENT =   12      SY=    120.0000000        PR  =        1 1
RG  =           1
NC  =          -9      LB  =        0.0          GB  =        0.0
TM1 =           0      TM2 =        0            APKN =          0
F1[PPM]=    14.065                F2[PPM]=    -6.032
HZ/CM=     361.88      PPM/CM=     1.0048        CX  =       20.000
CY  =        0.0       MAXX =      35            MAXY =      15.000
SR  =   4619.779       IS  =        1            AZFW =          0.0H
AZFE =          0      ABSG=        5                        ABSL=    3
FABE =          0      NOBC =       0            ISEN =       128
MI  =      10.000      PC  =        1.000        AI  =          0
PCO =        0.00      PC1 =        0.0          QS      GAMMA =     0.0
ALPHA =      0.0       NZP =        0            SREP =B
```

FIG. 10E

```
DO QN QP A3            DP  =       12L           TD  =        8K
AQ  =    .5652480      SI  =        8K           SF  =360.1346198
O1  =   4800.000       O2  =     5778.700        SW  =   7246.377
HZ/PT =    1.769       FW  =      9100           TE  =      297
RD  =        0.0       PW  =        0.0          NS  =        8
DS  =           2      DW  =       69            DE=        88.80
DR CURRENT =   12      SY=    120.0000000        PR  =        1 1
RG  =           1
NC  =          -2      LB  =        0.0          GB  =        0.0
TM1 =           0      TM2 =        0            APKN =          0
F1[PPM]=    14.065                F2[PPM]=    -6.032
HZ/CM=     361.88      PPM/CM=     1.0048        CX  =       20.000
CY  =        0.0       MAXX =      35            MAXY =      15.000
SR  =   4619.779       IS  =        1            AZFW =          0.0H
AZFE =          0      ABSG=        5                        ABSL=    3
FABE =          0      NOBC =       0            ISEN =       128
MI  =      10.000      PC  =        1.000        AI  =          0
PCO =        0.00      PC1 =        0.0          QS      GAMMA =     0.0
ALPHA =      0.0       NZP =        0            SREP =B
```

FIG. 10F

APPARATUS AND METHOD FOR DETECTING CANCER USING NUCLEAR MAGNETIC RESONANCE

STATEMENT REGARDING FEDERALLY SPONSORED RESEARCH

The funding for work described herein was provided by the Federal Government, under a grant from the Department of Health and Human Services. The Government may have certain rights in the invention.

CROSS REFERENCE TO A RELATED APPLICATION

This is a continuation of copending application U.S. Ser. No. 07/418,182 filed on Oct. 6, 1989 now abandoned which is a continuation-in-part application of prior pending application U.S. Ser. No. 325,773 now abandoned, filed Mar. 20, 1989 as a file wrapper continuation of U.S. Ser No. 262,073, now abandoned, filed Oct. 24, 1988 as a file wrapper continuation of U.S. Ser. No. 188,752, now abandoned, filed Apr. 29, 1988 as a file wrapper continuation of U.S. Ser No. 036,943, now abandoned, filed Apr. 10, 1987 as a divisional of U.S. Ser. No. 833,840 to Eric T. Fossel, filed Feb. 26, 1986, now abandoned.

BACKGROUND OF THE INVENTION

1. Field of the Invention

The present invention relates to an apparatus and diagnostic method for detecting cancer in a living patient.

2. Prior Art

Approaches utilizing the technique of nuclear magnetic resonance (NMR) to aid in arriving at a clinical diagnosis of cancer are well known in the prior art.

Damadian was the first to propose a medical use for NMR. He suggested it be used for detecting malignancy in tissue. See R. Damadian, "Tumor Detection by Nuclear Magnetic Resonance," *Science* 171:1151-1153 (1971). U.S. Pat. No. 3,789,832 issued to Damadian covers an apparatus and method for applying nuclear magnetic resonance to surgically removed specimens to measure $T_1$ and $T_2$ for proton relaxation times, which values, compared to values for healthy tissue, were taken as a means of diagnosing cancer. U.S. Pat. Nos. 4,411,270 and 4,354,499 issued to Damadian cover apparatus and method for cancer detection with NMR imaging and scanning of whole-body specimens.

A number of other investigators also reported that nuclear magnetic resonance relaxation times ($T_1$) for water protons in organs of tumor-bearing animals have higher values than the corresponding $T_1$ for water structure in organs of healthy animals See Frey et al, *J. Natl. Cancer Inst.* 49, 903 (1972); Inch et al, *J. Natl. Cancer Inst.* 52, 353 (1974); Iijima et al, *Physiol. Chem. and Physics* 5, 431 (1973); and Hazelwood et al, *J. Natl. Cancer Inst.* 52, 1849 (1974).

Today, despite uncertainty regarding the mechanistic details, it is well known that biophysical changes which occur in malignant cells often alter the proton NMR signal. See D. G. Taylor et al, "A Review of the Magnetic Resonance Response of Biological Tissue and Its Applicability to the Diagnosis of Cancer by NMR Radiology," *Computed Tomography,* 5:122-133 (1981). Such changes form the physical basis for detecting tumors by proton NMR imaging. See R. Zimmerman et al, "Cerebral NMR: Diagnostic Evaluation of Brain Tumors by Partial Saturation Technique with Resistive NMR," *Neuroradiology* 27:9-15 (1985) and K. Ohtomo, "Hepatic Tumors: Differentiation by Transverse Relaxation Time ($T_2$) of Magnetic Resonance Imaging," *Radiology* 155:421-423 (1985).

Proton NMR studies on excised tumors, as well as on plasma and serum, from experimental animals and patients have often shown differences in the relaxation parameters $T_1$, $T_2$, and $T_2^*$ ($T_2^*$ being a combination of $T_2$ from intrinsic relaxation and relaxation induced by magnetic field inhomogenieties) as a function of malignancy. Such findings have been reported by the following:

L. McLachlan, "Cancer-induced Decreases in Human Plasma Proton NMR Relaxation Rates," *Phys. Med. Biol.* 25:309-315 (1980);

F. Smith et al, "Nuclear Magnetic Resonance Imaging of the Pancreas," *Radiology* 142:677-680 (1982);

P. Beall et al, "The Systemic Effect of Elevated Tissue and Serum Relaxation Times for Water in Animals and Humans with Cancers," *NMR Basic Principles and Progress,* P. Diehl et al, Eds., 19:39-57 (1981);

R. Floyd, "Time Course of Tissue Water Proton Spin-Lattice Relaxation in Mice Developing Ascites Tumor," *Cancer Res.* 34:89-91 (1974);

C. Hazlewood et al, "Relationship Between Hydration and Proton Nuclear Magnetic Resonance Relaxation Times in Tissues of Tumor Bearing and Nontumor Bearing Mice: Implications for Cancer Detection," *J. Natl. Cancer Inst.* 52:1849-1853 (1974); and R. Klimek et al, "A Discussion of Nuclear Magnetic Resonance (NMR) Relaxation Time of Tumors in Terms of Their Interpretation as Self-organizing Dissipative Structures, and of Their Study of NMR Zeugmatographic Imaging," *Ginekol Pol.* 52:493-502 (1981).

However, due to extensive overlap of groups and small differences between the means of groups, these methodologies are not clinically useful.

While most of the prior art mentioned above suggests using NMR to analyze tissue, it is also known that body fluids are subject to such analysis, as discussed by Beall et al., supra.

The cited prior art NMR methods for detecting malignancy rely on the interpretation of the composite NMR signal arising from all protons in the tissue or blood derived samples. This composite signal is dominated by the water protons thus obscuring the NMR signal from other proton-containing sample constituents. A commonly held belief in the prior art is the apparent correlation between malignancy and observed changes in NMR parameters was due to "changes in water structure," quoting Frey et al., supra.

In other applications of proton NMR spectroscopy, it was known to suppress the signal from the solvent (such as water), in a sample. It was discovered that the components of the NMR spectrum which have significant predictive value may be masked by other materials in the sample. By eliminating the water signal, the previously masked spectrum of these components was revealed. In the U.S. Pat. No. 4,912,050 application of Eric T. Fossel, entitled "Process for the Detection of Cancer Using Nuclear Magnetic Resonance," filed Jan. 27, 1989, the teachings of which are incorporated herein by reference, the aforementioned discoveries were incorporated into a reliable method of diagnosing the presence of cancer in a living patient.

In accordance with that invention, a sample of a patient's bodily fluid is subjected to nuclear magnetic resonance spectroscopy to generate a nuclear magnetic resonance spectrum. A resonance line generated by a non-water component of the sample is selected, and the full width of this resonance line at a given height, e.g., at half its height, is measured. The full width so measured has proved to be a statistically reliable measure of the presence or absence of cancer in the patient.

The above-described test of water-suppressed proton NMR of plasma discriminates between persons with untreated cancers and others with better than 90% accuracy. As such, the test was widely acclaimed as one of the most important inventions of the decade. No prior non-invasive test for cancer has approached that level of accuracy. False positive results, however, have been obtained.

In the co-pending application of Eric T. Fossel, entitled "Process for the Detection of Cancer Using NMR (Carbon 13)," U.S. Ser No. 295,746, the teachings of which are incorporated herein by reference, it was shown that the major source of false positive results is people with high levels of plasma triglycerides. That invention teaches a non-invasive method and apparatus with improved accuracy over prior non-invasive methods to determine the presence of cancer in a living patient.

In accordance with that invention, the triglyceride level is measured of those patients with a positive result on the proton NMR diagnostic test. A normal triglyceride level confirms the cancer diagnosis; however, the fluid samples of patients with high triglyceride levels are subjected to C-13 NMR. An abnormal result in that test confirms the cancer diagnosis, whereas a normal result indicates that the prior diagnosis a false positive.

Nothing in the prior art, however, teaches an apparatus which automates the processes of obtaining NMR spectra, interpreting such spectra, and making diagnoses.

SUMMARY OF THE INVENTION

In accordance with the present invention, an apparatus was designed that is an improved nuclear magnetic resonance spectrometer. The present invention automates the process for diagnosing cancer using NMR. The apparatus has a spectrometer component capable of taking water suppressed proton NMR and C-13 NMR readings of a fluid sample. Additionally, the apparatus has computer means for processing the proton and C-13 readings and for obtaining a numerical value corresponding to those readings. The apparatus further comprises memory means for storing a set of standard or normal values. The apparatus also has means for comparing values obtained from the NMR spectra with the set of stored values in the memory means and for classifying the fluid sample on the basis of that comparison. The apparatus has computer programs which direct its function. Additionally, the programs analyze the data and yield a diagnosis with a great degree of accuracy.

In preferred embodiments, the sample fluid is blood, spinal fluid, or bone marrow plasma; blood is especially advantageous. The component of interest is lipidic, and is preferably from the methyl and methylene groups of the lipoprotein lipids.

Accordingly, an object of the present invention is to provide an apparatus and method of using an apparatus for automatic diagnosis of the presence of cancer in a living patient using NMR spectroscopy.

Other objects and advantages of the invention will become apparent from the descriptions of the drawings and the invention which follow.

BRIEF DESCRIPTION OF THE DRAWING

FIG. 4 is an expanded view of the methyl and methylene region of an NMR spectrum for a plasma sample for a patient with an untreated malignancy;

FIGS. 5A and 5B are C-13 NMR spectra of a plasma sample in the olefinic region for a normal control and an untreated cancer patient, respectively, obtained in accordance with the present invention;

FIG. 10B shows a sample program for shimming, corresponding to the proton spectrum step of the flowchart in FIG. 10A;

FIG. 10C shows a sample program for shimming, corresponding to a carbon-13 spectrum;

FIG. 10D shows a sub-program of step 8, RJ FQSET, of the shimming program shown in FIG. 10C;

FIG. 10E shows a sub-program of step 2, RJ TUNE, of the program shown in FIG. 10B; and FIG. 10F shows a sub-program of step 6, RJ FQSET, of the program shown in FIG. 10B.

DESCRIPTION OF THE PREFERRED EMBODIMENTS

Figure 1:
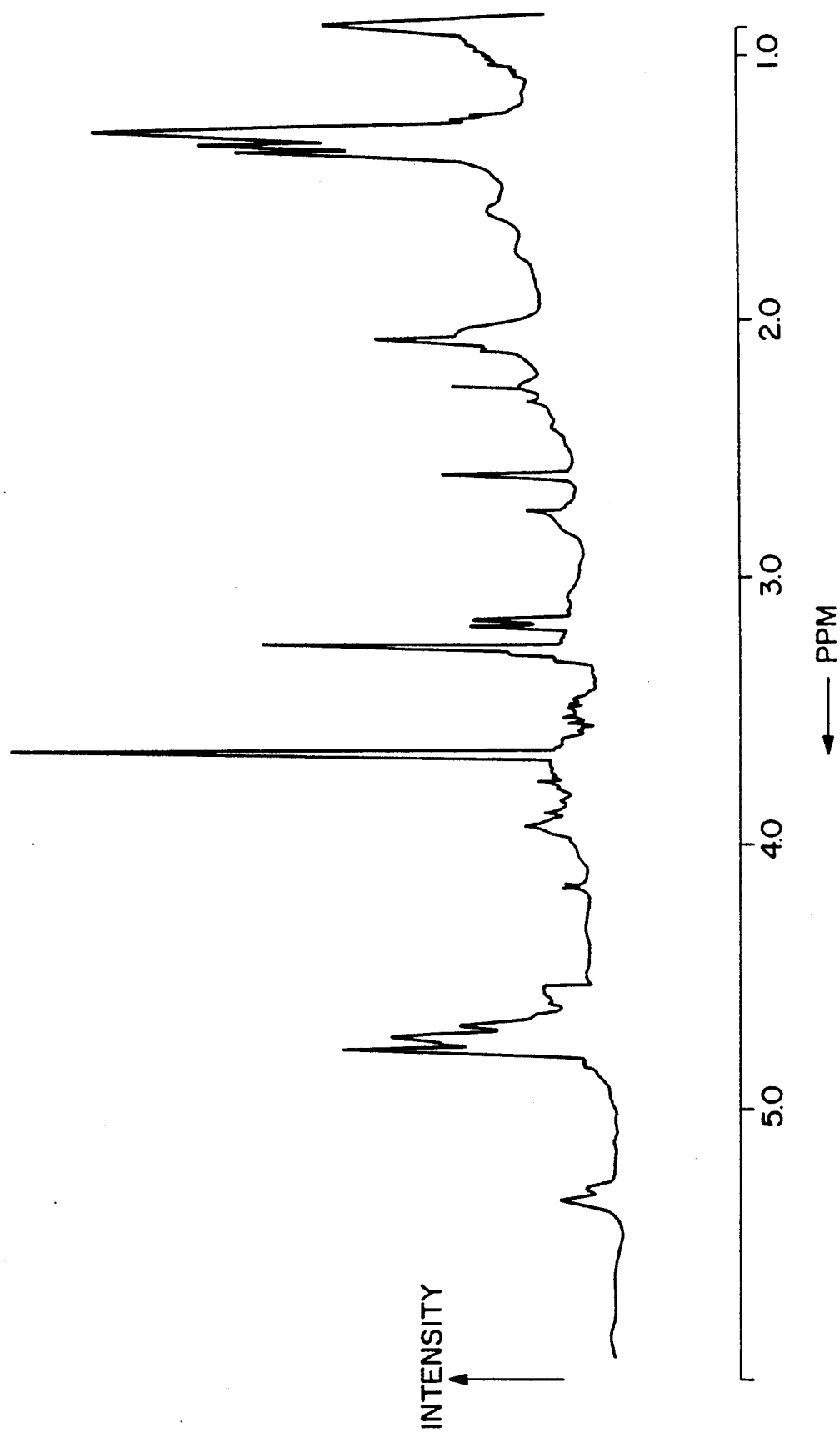
FIG. 1 is a typical 360 MHz NMR spectrum for the non-water components (water-suppressed) of a plasma sample from a healthy control obtained in accordance with the present invention.

At the outset, the invention is described in its broadest overall aspects with a more detailed description following. The present invention is a method to detect the presence of cancer in a living patient. In accordance with the invention, a sample of a patient's bodily fluid is subjected to proton nuclear magnetic resonance spectroscopy to generate a nuclear magnetic resonance spectrum. Since components of the NMR spectrum which have significant predictive value may be masked by other materials in the sample, the masking is eliminated to produce the NMR spectrum. A resonance line generated by a non-water component of the sample is selected, and the full width of this resonance line at a given height, e.g., at half its height, is measured to provide a reliable measure of the presence or absence of cancer in the patient. The theory of the above procedure is described in U.S. Pat. No. 4,912,050, the teachings of which are incorporated herein by reference.

In practice, a computer component of the apparatus makes the measurement, or measurements in the event that more than one resonance line is selected, and compares the average value obtained to a stored value which is indicative of the normal value; i.e., for a cancer-free person.

In the event that a positive reading is obtained, this reading may indicate the presence of cancer in the patient, or it may be a false positive reading. It has been discovered that a major source of false positive readings are persons with high levels of plasma triglycerides. Accordingly, if the measured value is greater than the normal value, the program will diagnose the patient as cancer-free. However, if the measured value is less than the stored value, the program will direct the apparatus to obtain a measure of the patient's triglyceride level.

In order to differentiate between true and false positive readings, the sample tested previously is subjected to C-13 NMR spectroscopy for those who have elevated triglyceride levels. The false positive results due to hypertriglyceridemia and, conversely, the presence of cancer in the patient, can be reliably determined from certain features of the C-13 spectra.

In one embodiment of this invention, proton NMR spectroscopy is performed initially on the sample to be tested. The water suppressed proton NMR spectrum obtained on human blood plasma is dominated by the resonances of the plasma lipoprotein lipids. Without water suppression, these non-water resonances are virtually overwhelmed by the water. Signal averaging allows observation of resonances of some moieties associated with non-water bodily fluid components, at high magnetic fields, even in the presence of the water resonance. However, the capability of modern NMR spectrometers to suppress nearly completely the water proton resonance will facilitate this reading. The water suppressed proton NMR spectrum of plasma is essentially that of plasma lipoproteins and a few low molecular weight molecules. The protons of the proteins of plasma are obscured because they comprise a broad smear of unresolved resonances. The sharper resonances of the more mobile lipoprotein protons are superimposed on this broad background.

The apparatus of the present invention operates on any lipid-containing body fluid. Whole blood, serum or plasma may be used. While the test may be performed on any such lipid-containing body fluid, work to date has focused on blood plasma. In blood, the lipids, inclusive of cholesterol, triglycerides, and phospholipids, are present in the form of lipoproteins. The test for cancer will typically be performed in vitro, preferably on serum or plasma.

The selected fluid of a suspect patient or other person to be screened for cancer is exposed to both a magnetic field and radio-frequency energy to generate a nuclear magnetic resonance signal which is then processed by the apparatus which obtains a value for a selected parameter, e.g., $W_{\frac{1}{2}}$, for lipid methyl and/or methylene protons. A relatively broad range of proton frequencies may be employed, e.g., 60 MHz and higher; 360 MHz or above is a preferred frequency. If cost is not a factor, 500 MHz may be the preferred frequency.

Figure 2:
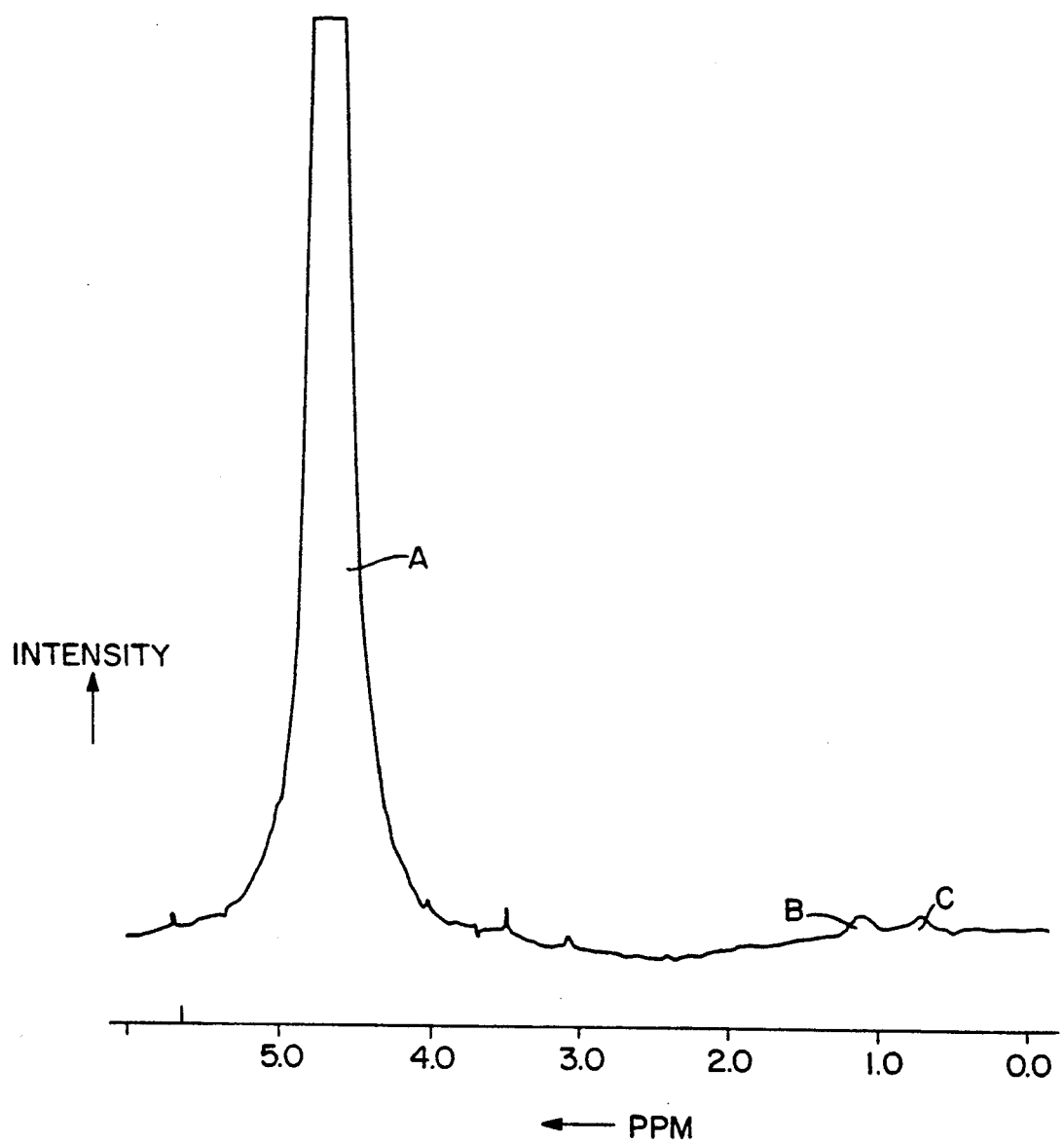
FIG. 2 is an NMR spectrum for the same plasma sample from which the spectrum of FIG. 1 was obtained, using the same equipment and pulse frequency except without water suppression.
Figure 3:
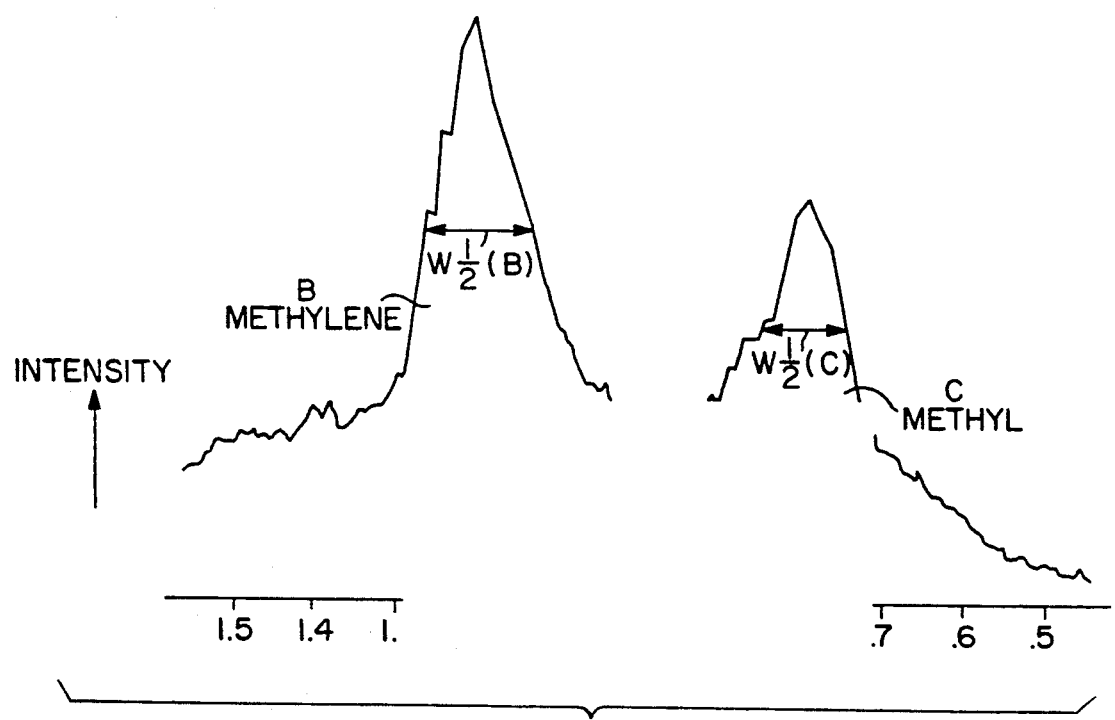
FIG. 3 is an expanded view of the methyl and methylene region of the reading of the sample of FIG. 1.

FIG. 1 shows a water suppressed proton spectrum of a healthy control, and FIG. 2 shows a proton spectrum of the same sample without water suppression. The truncated resonance line of water is denoted A in FIG. 2. The resonance lines between 0.5 and 2 ppm (parts per million of resonance frequency) arise from the methyl and methylene groups of the lipoprotein lipids. An expanded view of this region of the proton spectrum is shown in FIG. 3 for a normal control and in FIG. 4 for a patient with untreated malignancy. Accordingly, in its preferred embodiments, the present invention uses one of a number of conventional water suppression techniques, i.e., techniques for suppression of the water proton NMR signal. Numerous techniques have been devised to suppress the water proton NMR signal in other contexts. These may be broadly divided into two categories: (1) those that aim not to excite the water proton signal, e.g., rapid scan correlation spectroscopy and the selective excitation technique, and (2) those that arrange for the water proton magnetization to be extremely small at the time the observed radio frequency (rf) pulse is applied, e.g., the inversion recovery technique and saturation. These and other solvent suppression techniques are described by P. J. Hore in "Solvent Suppression in Fourier Transform Nuclear Magnetic Resonance," *Journal of Magnetic Resonance* 55:283–300 (1983) and the references footnoted therein. Although the water suppression technique is preferred when using a conventional NMR apparatus due to its inability to distinguish between the signal of the solvent protons and those of the moiety or species of interest, a sufficiently sensitive apparatus would eliminate the need for water suppression altogether.

The linewidth at half-height of the resonances of moieties, e.g., methyl and methylene groups, associated with the lipids of plasma lipoproteins are treated as the variable of interest. Full width at half-height $W_{\frac{1}{2}}$ (linewidth) of an NMR resonance line is inversely proportional to the apparent spin-spin relaxation time ($T_2^*$), i.e.

$$W_{\frac{1}{2}} = \frac{1}{T_2^*}$$

The apparatus then compares the detected value for the selected parameter with the corresponding parameter for the healthy controls. In a preferred embodiment, values for methyl and methylene are averaged and an average value of 33 Hz or less at a proton frequency of 360 MHz (8.45T) or 400 MHz (9.40T) is taken as an indication of malignancy.

If a positive reading is obtained from the water suppressed proton NMR spectrum of a plasma sample from a patient, a second level of testing to confirm the diagnosis is performed. First, a conventional test, commonly called a triglyceride analysis, is performed to determine the triglyceride level of the patient. If the triglyceride level is normal, the positive reading from the water-suppressed proton NMR spectroscopy is a true positive and indicates the presence of cancer in the patient. If the triglyceride level is above normal, in order to differentiate between true and false positive results, the program directs the apparatus to obtain a C-13 NMR spectrum of the patient's plasma sample which is already available because of the earlier proton NMR spectrum.

False positive results due to hypertriglyceridemia can be reliably distinguished from true positive results by substantial differences in certain features of C-13 spectra. Accordingly, the plasma sample already obtained from the suspect patient to be screened is exposed to a magnetic field and radio frequency energy to generate a nuclear magnetic signal which is then processed to obtain a value for C-13.

Initially, the olefinic region, 120-140 ppm, of the spectrum is examined. Two peaks will appear, one at approximately 128-129 ppm and another at approximately 130-131 ppm, about 2 ppm apart. The ratio of the resonance at the general region of 128 ppm to that at 130 ppm is determinative of cancer. In readings of plasma from normal controls and from persons with non-cancer disease, the ratio of the height of those two resonances (128/130 ppm) is 0.9 or greater, i.e. the resonance peak at 128 ppm is approximately equal to or taller than that at 130 ppm. The heights of the peaks are measured by computer from the center of the baseline noise to the top of the peak. In readings of plasma from patients with untreated cancer, the ratio of the peak heights is less than 0.86, or the resonance peak at 130 ppm is taller, by at least 5%, than that at 128 ppm. It should be noted that in patients with hypertriglyceridemia, the ratio of the height of the resonances (128/130 ppm) is the same as normal control values. Accordingly, the computer will calculate the ratio of the peak heights already measured, and if the ratio is greater than a stored value will diagnose the patient as healthy, but otherwise will render a diagnosis of cancer. In a preferred embodiment, the stored value is 0.9.

FIGS. 5A and 5B show the olefinic regions of spectra taken at 125.76 MHz with broadband proton decoupling from a normal control patient and an untreated cancer patient. In FIG. 5A, the ratio is 1.14 in the normal control patient and in FIG. 5B the ratio is 0.70 in the untreated cancer patient. In the patients with hypertriglyceridemia that were studied, the ratio ranged from 1.05 to 1.68.

The changes in the olefinic region of the spectra of untreated cancer patients can be explained by increases or decreases in polyunsaturated fatty acid chains in the lipids. The levels of oleic acid and linoleic acid are particularly indicative.

Oleic acid is a monounsaturated fatty acid and is made by the human body. Linoleic acid is a polyunsaturated fatty acid, having two double bonds, and is not made by the human body, but is obtained by consumption. Dietary fatty acids include polyunsaturated acids, such as linoleic acid. A resonance peak in the general region of 128-129 ppm evidences only linoleic acid in the patient. A resonance peak at the general region of 130-131 ppm evidences both oleic and linoleic acid in the patient.

It has been discovered that the height of those resonance peaks, relative to each other, are affected by certain conditions of the patient. For example, persons with high triglyceride levels usually have a high ratio of linoleic acid to oleic acid levels. Patients with untreated cancer are found to have low levels of linoleic acid in their bodies, presumably because cancer causes oxidation of polyunsaturated fatty acids, including linoleic acid. This is consistent with the hypothesis that lipids are oxidized by hydroxyl free radicals in cancer patients since polyunsaturated fatty acids are most susceptible to oxidation.

Accordingly, if the subject patient has both high triglycerides and untreated cancer, the resonance peak at 130 ppm will be higher, reflecting the decreased linoleic acid in both peaks. If, however, the peak at 128 ppm is not shorter than that at 130 ppm by more than 7%, no depression, or an insignificant depression, of linoleic acid levels has occurred, and the positive result obtained from the proton NMR spectra is confirmed as a false positive. In that case, the apparatus renders a diagnosis of no cancer present.

Figure 6B:
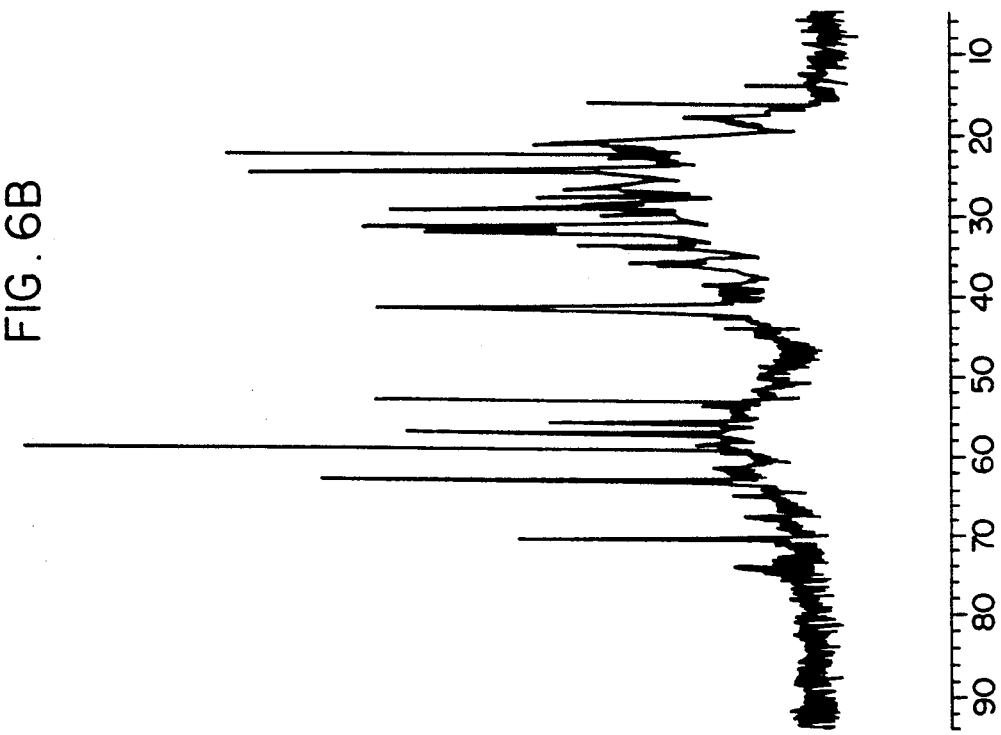
FIGS. 6A and 6B are views of the C-13 NMR spectral region between 10 ppm and 90 ppm, with particular inclusion of the region between 48 ppm and 80 ppm, of the plasma samples shown in FIGS. 5A and 5B for a normal control and an untreated cancer patient, obtained in accordance with the present invention.
Figure 6A:
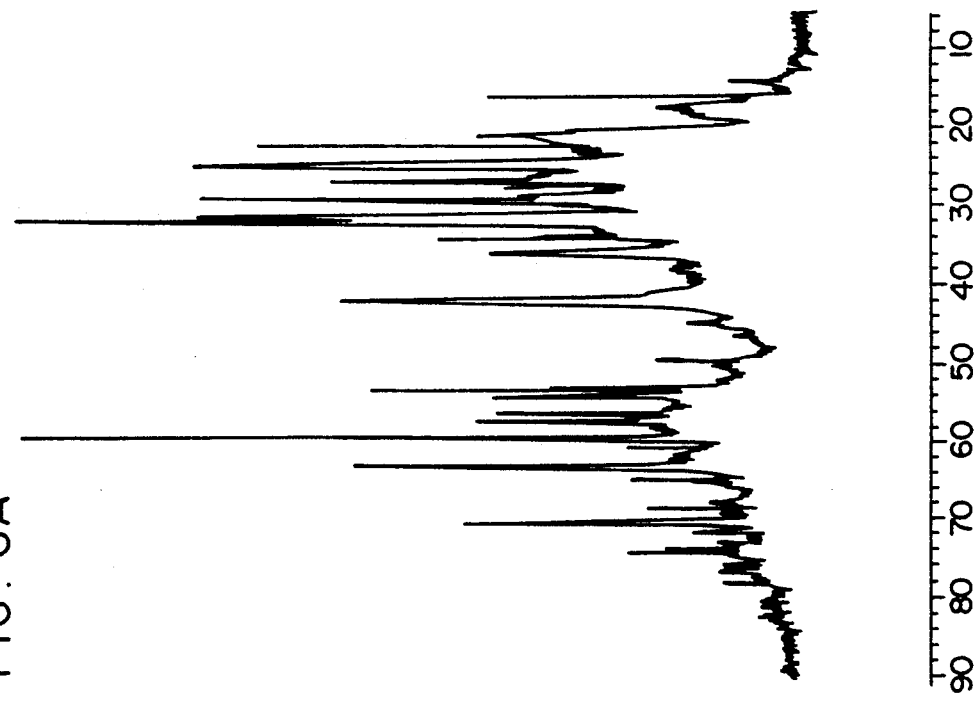

In addition, the spectral region between 48 ppm and 80 ppm is far more complex in untreated cancer plasma than in normal control or hypertriglyceridemia plasma. By "more complex" is meant that there are more resonance peaks in the region. A resonance peak is counted by the program if its height is at least 50% greater than that of the background noise during a normal testing period. As those skilled in the art will know, the longer data is collected, the more noise lessens and the more clearly peaks show. FIGS. 6A and 6B show this region for normal control and untreated cancer plasma, respectively. These spectra were obtained at 125.76 MHz using a 5 mm sample tube and 14 hour accumulations. C-13 spectra with adequate information can also be obtained at 90.5 MHz in 10 mm or longer sample tubes. Of course, changes to various parameters of the conditions under which the test can be run will be evident to those skilled in the art.

These parameters include the size of the sample tube, the pulse width, the pulse repetition rate, and the exponential multiplication of the free induction decay by different factors. For example, it is obvious to those skilled in the art that the larger the sample tested, the faster spectra of adequate quality will be obtained. Other changes to the conditions given here will be evident to those skilled in the art.

C-13 NMR spectroscopy can be performed initially on a patient as a method to diagnose the presence of cancer, without first performing a proton NMR spectroscopy as described above. The C-13 NMR spectroscopy, however, is time consuming, and therefore expensive to perform. While a proton NMR spectroscopy generally takes 30 seconds to perform, C-13 spectroscopy may take anywhere from one to fifteen hours. This increases costs accordingly. Accordingly, in a preferred embodiment, C-13 spectroscopy is used to verify the positive results obtained from the proton NMR spectra to illuminate statistically and clinically significant differences in a plasma C-13 spectra between true and false positive results from the proton water suppressed NMR spectroscopy test.

In the preferred embodiments, an NMR spectrometer with a magnet at constant field strength is used and the NMR signal is Fourier transformed, with the full linewidth at half-height for proton resonances of methyl and methylene groups, and then C-13 resonances of linoleic and oleic acid, being the NMR parameters of interest.

As noted in parent application, U.S. Ser. No. 833,840, correct sample preparation and execution is essential to carry out a successful measurement on plasma. Blood is collected in tubes containing 70 microliters of a solution of 15% Na$_2$EDTA. Blood was maintained at 4° C. until centrifugation. Plasma was separated and stored at 4° C. until NMR analysis. Plasma samples were never frozen because freezing destroys lipoprotein lipid structural integrity. Samples which showed any visible sign of hemolysis were excluded.

All spectra were obtained at 20°-22° C. at magnetic field strengths of 360 MHz or greater. The samples were shimmed individually by computer on the area of the proton free induction decay until the full width at half height of the water resonance was 4 Hz or less. Of course, careful shimming is an assumed component of good NMR laboratory technique.

It can be seen that of those experimental conditions, temperature and shimming are not as critical with the C-13 NMR spectroscopy because a measurement of the linewidth is not taken. Of course, the field strength used will determine the length of time in which a sample is taken. In addition, to the experimental conditions, accurate results require careful review of a patient's medical record to arrive at the patient classification.

Figure 9:
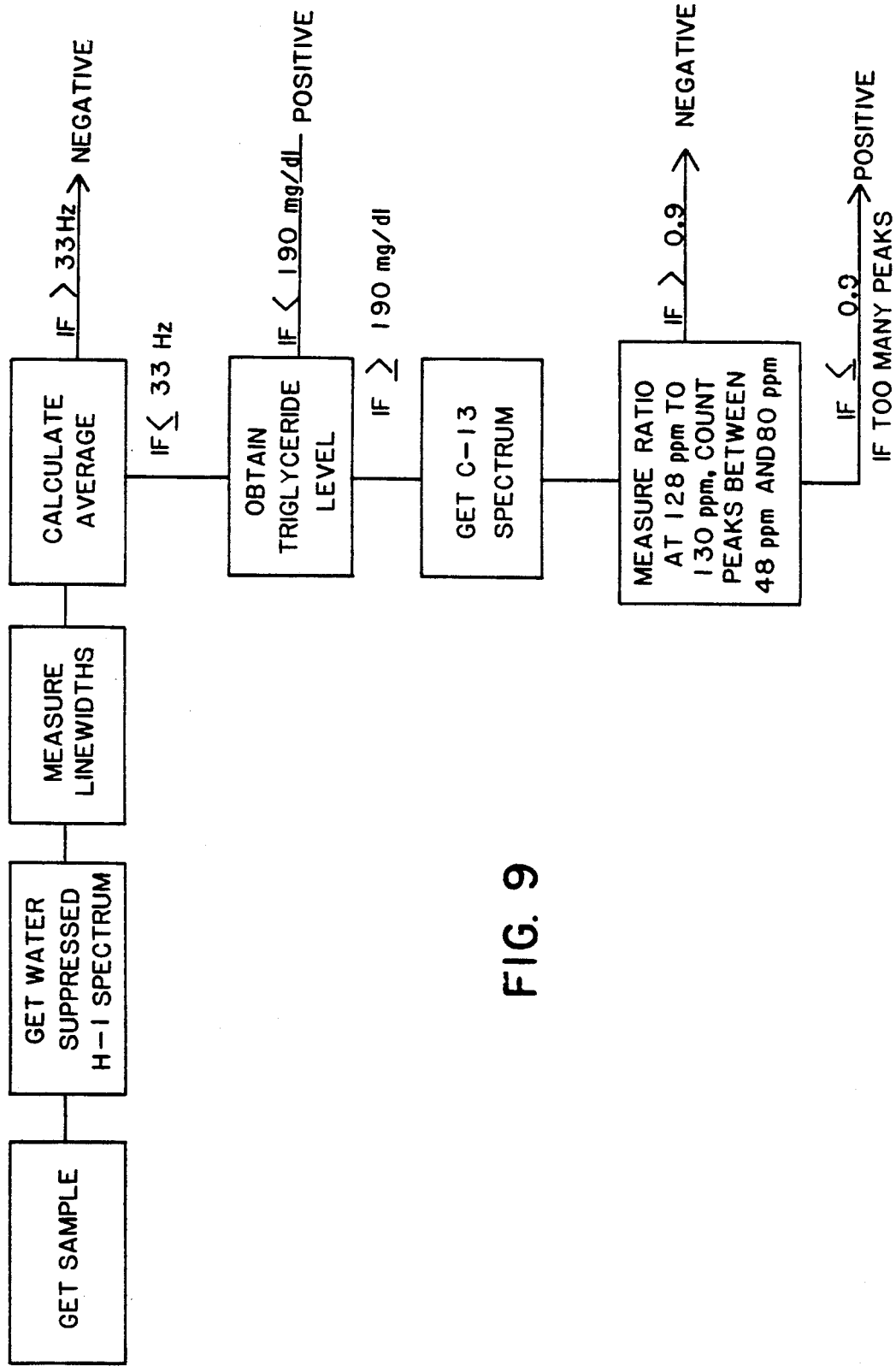
FIG. 9 shows a flowchart diagramming the operations of the apparatus of the invention.

FIG. 9 shows a flowchart of the operation of the apparatus in which the apparatus first obtains a sample of bodily fluid and then submits it to NMR spectroscopy to obtain a water-suppressed H-1 spectrum. The apparatus then selects and measures resonance lines and finds an average linewidth which it compares with the value 33 Hz, a predetermined normal value. If the average linewidth is greater than 33 Hz, the apparatus will yield a negative diagnosis; otherwise, it will obtain a measure of the triglyceride level in the patient. If the triglyceride level is less than 190 mg/dl then it will render a positive diagnosis; otherwise, it will obtain a C-13 spectrum of the sample. It will then analyze the C-13 spectrum by measuring the ratio of the peak at 128 ppm to the peack at 130 ppm and by counting the number of peaks in the range 48 ppm to 80 ppm. If the ratio is 0.9 or greater, the machine will yield a negative diagnosis; however, if the ratio is less than 0.9 or there is an abnormally high number of peaks in the range 48 ppm to 80 ppm then the apparatus will diagnose the patient as having cancer.

Figure 7:
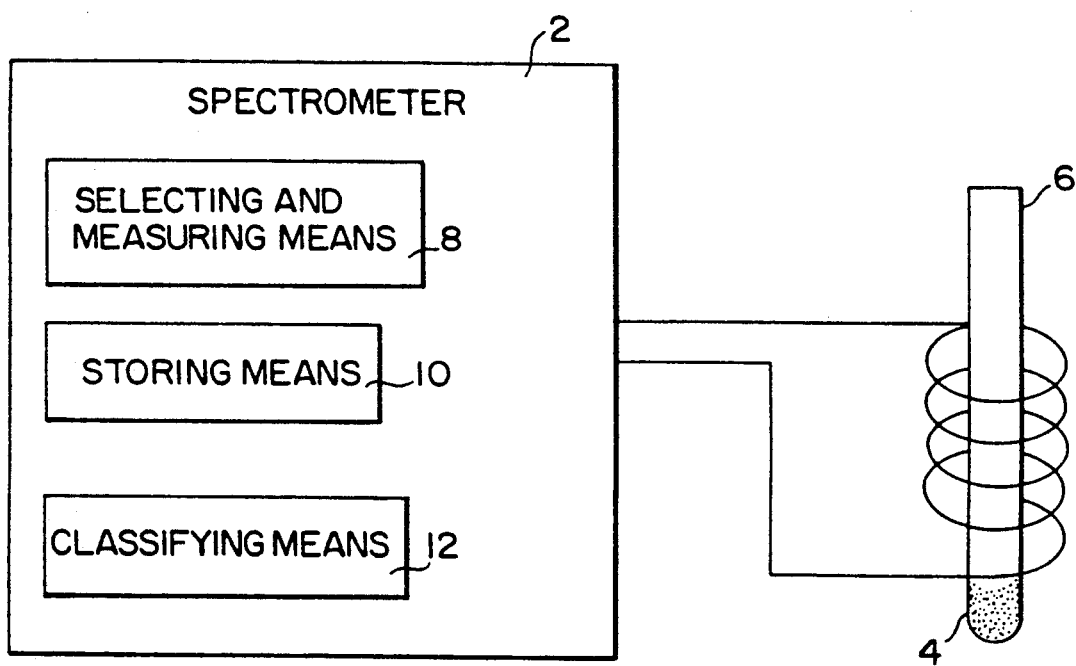
FIG. 7 schematically illustrates the apparatus of the present invention.
Figure 10A:
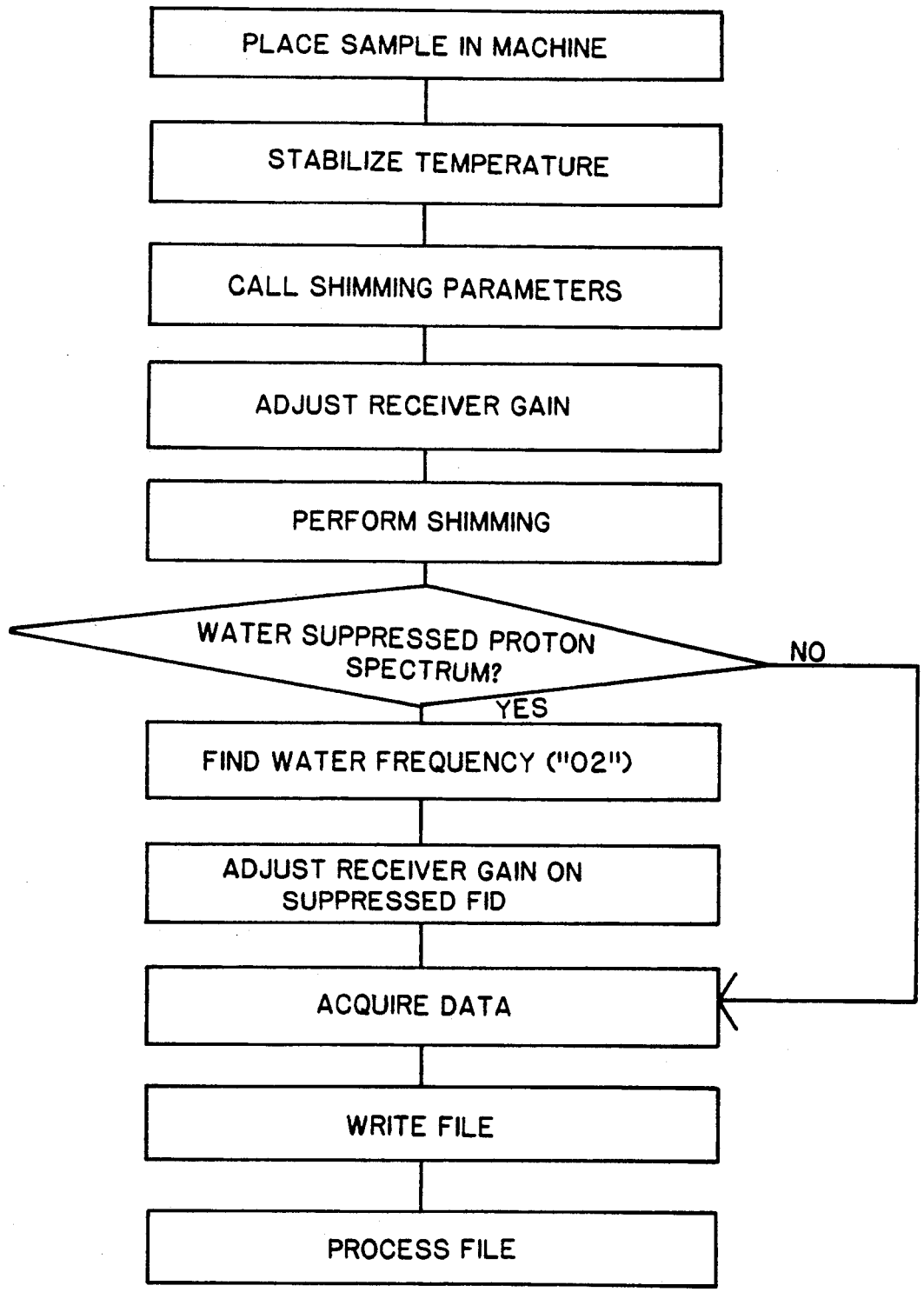
FIG. 10A shows a flowchart for shimming, a task carried out by the apparatus which ensures reproducible results from water suppressed readings.

Referring now to FIG. 7, there is illustrated a nuclear magnetic resonance (NMR) spectrometer 2 which in the preferred embodiment is capable of performing proton and C-13 NMR spectroscopy and which is preferably, but not necessarily, of the type that suppresses the NMR signal of water. In order to produce reproducible H-1 or C-13 spectra, it is necessary to shim. The procedure for shimming is shown as a flowchart in FIG. 10A in which a sample is placed into the machine, the temperature is stabilized, the shimming parameters called, the receiver gain is adjusted, shimming is performed, the water frequency is found for H-1 water suppressed spectra, the receiver gain is adjusted on the suppressed proton frequency induction decay area for water suppressed spectra, data is acquired, a file is written, and the file is processed. FIG. 10B shows a program (written using the Bruker DISNMR software package) used to automatically perform the procedures depicted in FIG. 10A. FIG. 10C shows a sample program for shimming, corresponding to a carbon-13 spectrum. FIG. 10D shows a sub-program of step 8, RJ FQSET, of the shimming program shown in FIG. 10C. FIG. 10E shows a sub-program of step 2, RJ TUNE, of the program shown in FIG. 10B; and FIG. 10F shows a sub-program of step 6, RJ FQSET, of the program shown in FIG. 10B. The spectrometer 2 is adapted for examination of a sample 4, which in this example is human blood plasma contained within a test tube 6.

In accordance with the invention, the spectrometer 2 contains computer means 8 for selecting at least one and preferably a plurality such as two NMR resonance lines in the NMR spectrum of the sample 4 and measuring the linewidth of the line or lines so selected. Preferably, the linewidth is measured at half the height of the line, but this is not necessary and linewidth can be measured at any predetermined fraction of the height of the line in question. Measurement at half of line height is preferred because this is a standard measurement carried out in the field of NMR spectroscopy. Several commercially available computer programs can be used for automatically measuring full linewidths at half height.

The computer selecting and measuring means 8 of spectrometer 2 of the invention also measures selected peaks for the examination of the C-13 NMR spectra. The spectrometer 2 also is of conventional construction and includes in addition to all its other structure a computer storage means 10 for storing a value or range of values. In accordance with the invention, the spectrometer 2 also includes computer classifying means 12 for comparing a linewidth which is either measured directly or derived from a plurality of such direct measurements with a value or range of values which represents the value or range of values to be expected from normal patients, i.e. patients who are free of cancer. Computer classifying means 12 are also used for classifying the measured or derived linewidths, peak heights, and number of peaks as normal (i.e. cancer-free) or abnormal (i.e. cancerous) based upon the stored information. This may be done by comparison, subtraction, or any other appropriate mathematical operation.

In a preferred embodiment, the computer selecting and measuring means 8 is pre-adjusted to measure the linewidths of the methyl and methylene groups of the lipoprotein lipids, and the peak heights and number of peaks in the C-13 NMR spectra. This may include suppressing the signal of water from the NMR spectrum of the sample 4, or may alternatively be done directly where the spectrometer 2 is sensitive enough to do so.

In a preferred embodiment, the linewidths of the methyl and methylene groups are averaged by the computer measuring means 8 to produce a composite linewidth which is the mathematical mean of the two. This composite linewidth is compared with 33 Hz, the value which is preferably stored in the computer storing means 10, by the computer classifying means 12. When the comparison shows that the composite linewidth is less than 33 Hz, this indicates an abnormal (i.e. cancerous) sample 4.

EXAMPLE

In this example, the method of the present invention was applied to a group of 135 patients undergoing breast biopsy for palpable and non-palpable breast lesions. For the prospective breast study, blood was collected and maintained at 4° C. until centrifugation. Blood was collected in non-siliconized vacutainer tubes containing 70 microliters of a solution of 15% $Na_2EDTA$. Plasma was separated and stored at 4° C. until NMR analysis. Plasma samples were never frozen because freezing destroys lipoprotein lipid structural integrity. Samples which showed any visible sign of hemolysis were excluded.

Plasma triglyceride concentrations were measured (Damon Clinical Laboratories, Westwood, Massachusetts) on all fresh plasma samples. All spectra were obtained at 21° C. using an improved spectrometer of the present invention operating at 360 MHz for proton (H-1) and 90.5 MHz for carbon (C-13). Additional C-13 spectra were obtained on an 11.8 T Bruker AM spectrometer operating at 125.7 MHz. All studies were carried out in 5 mm OD sample tubes (Wilmad, Vineland, N.J.; #507PP or #528PP). Each sample, containing 0.6 ml plasma, was shimmed individually on the area of the proton free induction decay (FID) until the full-width at half-height (FWHH) of the water resonance was 4

Hz or less. An internal quality control was found in the linewidth of the EDTA resonances. If all was well with the sample preparation and shimming, the linewidth (FWHH) of the EDTA resonances (without exponential broadening) had to be 2 Hz or less and was often between 1.0–1.5 Hz. In order to accomplish this, most H-1 probes require detuning to avoid radiation damping. The probe was detuned until the 90° radio-frequency pulse became 20 msecec. In the 8.45 T spectrometer, this resulted in probe detuning of about 2 MHz. The sample was spun during shimming of the Z shim coils and during data acquisition. Our H-1 spectra were acquired using presaturation to suppress water and an inversion-recovery sequence to null any lactate methyl protons present. The presaturation pulse was 4.0 sec, with a delay of about 0.8 sec between the 180° and 90° pulse. Eight FIDs were signal averaged and then Fourier transformed following multiplication by an exponential resulting in 2 Hz line-broadening. The portion of the spectrum form 0.5 to 1.6 ppm was phased so that the baseline level at the edges of the plot was the same. This resulted in defective phasing of other (non-plotted) portions of the spectra.

C-13 spectra were obtained at 8.45 T and 11.5 T signal with broadband proton decoupling by averaging between 2,000 and 28,000 FIDs depending on signal-to-noise level and resolution desired. The sample was identical to the samples for H-1 spectra except 100 microliters of $D_2O$ was added for field lock. It was found that a minimum of 2,000 FIDs were required to produce reliable resonance intensities. Exponential multiplication equivalent to 25 Hz line-broadening was used in the spectra obtained at 8.45 T.

Figure 8:
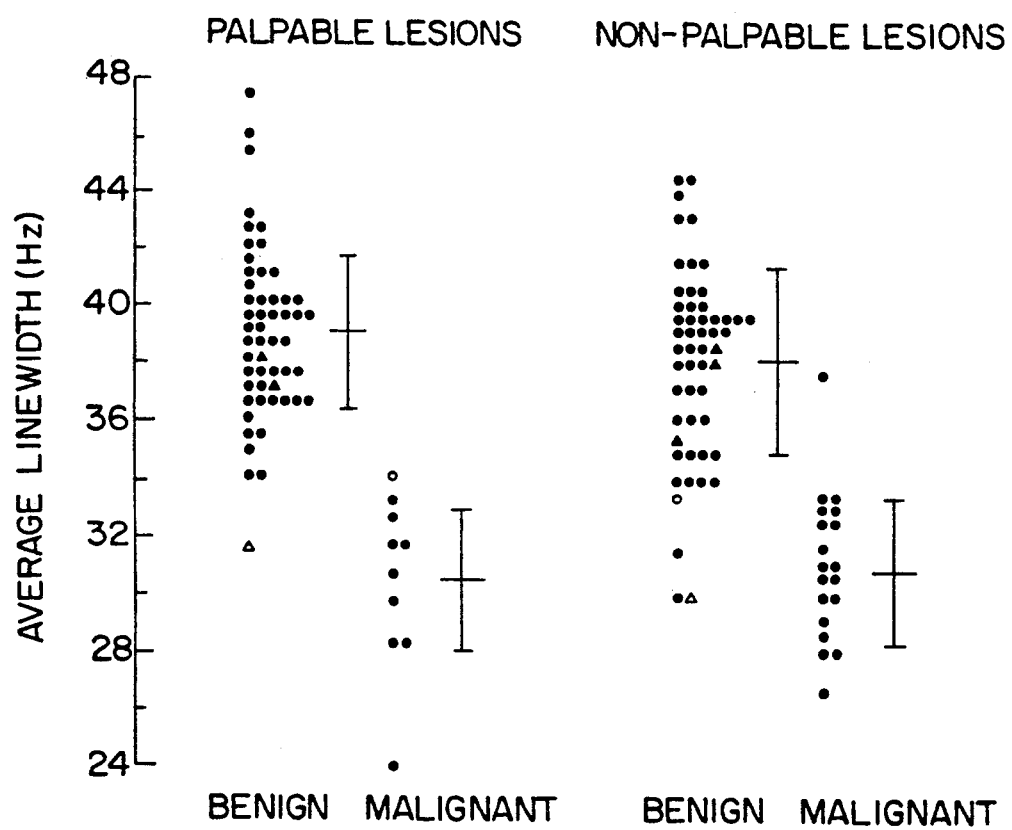
FIG. 8 shows the results of a study performed using the method of the present invention.

In this study, we prospectively obtained plasma from a series of women undergoing breast biopsy. Samples were drawn prior to the biopsy, analyzed by NMR using the invention, and results were then correlated with pathology reports. Two groups of patients were included in this study; 63 patients with palpable lesions and 72 patients with mammographically discovered, non-papable lesions requiring wire localization. Results of the H-1 NMR spectroscopic evaluation are shown in FIG. 8. In both groups, benign lesions were clearly distinguished from malignant ($p<0.0001$) based upon the proton values. For those values, triangles indicate patients who also had elevated triglyceride values. The open symbols indicate samples in which the C-13 results conflicted with the proton results. Thus, for the open symbols, the sample would be changed from the benign column to the malignant column or vice versa.

The patients in the study were a group of otherwise healthy women, outpatients, referred for evaluation because of an abnormality on a routine breast examination or a screening mammogram. In this group, the sensitivity and specificity were 93% and 95%, respectively. The predictive value of a positive test was 84%, and the predictive value of a negative test was 98%. Reclassifying patients on the basis of the C-13 data raises the sensitivity and specificity to 97% and 98%, respectively, and the predictive value of a positive test to 93%. These data would suggest that the H-1 NMR linewidth, confirmed by a C-13 ratio, might be used as an aid in decision making in patients with breast lesions.

There were five apparent false positive and two false negative results. Elevated triglyceride levels (265 mg/dl and 206 mg/dl) were associated with two of the five false positives and no false negatives. The C-13 ratio was negative in three false positives, two of which also had elevated triglycerides; and it was positive in two patients. The C-13 ratio was positive in all but one of the cases with malignant breast biopsies. The one false negative by C-13 was also negative by H-1. While patients with elevated triglyceride levels may need to be evaluated also by C-13, not all patients with elevated triglycerides had narrowed linewidths.

The invention may be embodied in other specified forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range or equivalency of the claims are therefore intended to be embraced therein.

What is claimed is:

1. An apparatus for automating the diagnosis of the presence of cancer in a living patient by testing a sample of bodily fluid from the patient, said apparatus comprising:

means for automatically inserting a sample into an NMR spectrometer;

means for automatically generating a proton NMR spectrum from which undesirable signals have been suppressed from the bodily fluid sample;

computer means for automatically measuring the full width at half-height of a lipoprotein resonance line in said automatically generated proton NMR spectrum;

computer means for storing said measured full width at half-height of the lipoprotein resonance line in said automatically generated proton NMR spectrum;

computer means for storing a predetermined normal standard value or range of values of full widths of half-height of lipoprotein resonance lines;

computer means for automatically comparing and classifying said measured and stored full width at half-height against the stored predetermined standard and determining whether said measured full width is normal or abnormal, abnormal indicating the presence of cancer;

means for measuring the triglyceride level of the bodily fluid sample utilized when the bodily fluid is classified as having abnormal full widths;

means for classifying the measured triglyceride level into a category of normal level or abnormal level;

means for automatically generating a C-13 nuclear magnetic resonance spectrum from the bodily fluid utilized when said bodily fluid's classified triglyceride level is abnormal;

computer means for automatically measuring a ratio of the resonance peaks from said generated C-13 resonance spectrum;

computer means for storing the measured ratios of the resonance peaks from said generated C-13 resonance spectrum;

computer means for storing a predetermined standard for ratios of normal C-13 resonance peaks;

computer means for automatically comparing and classifying the ratio measured and stored against the stored predetermined standard for ratios and determining whether said measured ratio is normal or abnormal for which abnormal indicates the presence of cancer; and means for automatically reporting a diagnosis.

2. The apparatus of claim 1 wherein the means for automatically generating a proton NMR spectrum from which undesirable signals have been suppressed further comprises suppressing water proton signals.

3. An improved NMR spectrometer for screening patients who do not have cancer from those who might have cancer using fluid samples from the patients, comprising:

means for automatically obtaining an H-1 NMR spectrum;

computer means for automatically measuring linewidths of said H-1 resonance spectrum;

computer means for storing a predetermined normal linewidth value;

computer means for determining whether the average of said measured linewidths is less than the predetermined normal linewidth value in order to separate out samples with no likelihood of cancer.

means for obtaining a measurement of triglyceride levels in the samples which have been determined to have a likelihood of cancer;

means for storing a predetermined triglyceride level value;

means for determining whether said measured triglyceride levels are greater than the predetermined triglyceride level value in order to separate out samples with a possibility of not having cancer;

means for automatically obtaining a C-13 NMR spectrum for samples determined of having a possibility of cancer;

computer means for automatically measuring a ratio of the C-13 NMR resonance peak at 128 ppm to the resonance peak at 130 ppm;

computer means for storing a predetermined ratio value for normal C-13 NMR spectra;

computer means for automatically determining whether said determined ratio is greater than the predetermined ratio value in order to separate out samples with no likelihood of cancer;

computer means for automatically counting the number of peaks in the range of 48 ppm to 80 ppm;

computer means for storing a standard number of peaks in the range from about 48 ppm to about 80 ppm;

computer means for automatically determining whether the number of peaks in the range from about 48 ppm to about 80 ppm is substantially larger than the standard number of peaks in the range from about 48 ppm to about 80 ppm in order to separate out those samples with a likelihood of cancer; and computer means for automatically reporting a diagnosis.

4. The improved NMR spectrometer of claim 3 wherein the means for obtaining the H-1 resonance spectrum comprises:

means for suppressing a water proton signal from the resonance spectrum generated; and means for producing from said resonance spectrum an aliphatic portion of a resonance line.

5. The improved NMR spectrometer of claim 3 wherein said means for measuring linewidths includes means for measuring linewidths at half-height.

6. The improved NMR spectrometer of claim 3 wherein said computer means for storing a predetermined normal linewidth value includes a predetermined value of 33 Hz.

7. The improved NMR spectrometer of claim 3 wherein said means for storing a predetermined triglyceride level value includes a predetermined triglyceride level value of 190 mg/ml.

8. The improved NMR spectrometer of claim 3 wherein said means for storing a predetermined ratio value for normal C-13 NMR spectra includes a predetermined ratio value of 0.9.

9. An improved NMR spectrometer for screening patients who do not have cancer from those who might have cancer using fluid samples from patients, comprising:

means for obtaining an H-1 resonance spectrum including means for suppressing a water proton signal and means for producing the aliphatic portion of the resonance line;

computer means for automatically measuring the linewidths at half-height on said H-1 resonance spectrum;

computer means for automatically determining whether the average of said measured linewidths at half-height is less than 33 Hz;

means for obtaining a measurement of triglyceride level in the samples determined to have average linewidths less than 33 Hz;

means for determining whether said measured triglyceride levels are higher than 190 mg/ml;

means for automatically obtaining C-13 NMR spectra of samples determined to have triglyceride levels higher than 190 mg/ml;

computer means for automatically measuring ratios of the resonance peak at 128 ppm to the resonance peak at 130 ppm on the C-13 resonance spectra;

computer means for automatically determining whether said measured ratios of resonance peaks at 128 ppm to 130 ppm are larger than 0.9;

computer means for automatically counting the number of peaks of said C-13 resonance spectra of samples determined to have triglyceride levels higher than 190 mg/ml in the range from about 48 ppm to 80 ppm;

computer means for determining whether the counted number of peaks in the range from about 48 ppm to about 80 ppm is substantially larger than a standard number of peaks in the range from about 48 ppm to about 80 ppm in order to separate out those samples with a likelihood of cancer; and means for automatically reporting a diagnosis.

10. A non-invasive method for the automatic diagnosis of the presence of cancer in a living patient comprising:

a) taking a bodily fluid sample from a patient;

b) placing the bodily fluid sample in an automated NMR spectrometer apparatus; and c) generating and analyzing data from said automated NMR apparatus to determine the presence of cancer comprising:

i) generating a proton NMR spectrum from which undesirable signals have been automatically suppressed from the bodily fluid sample;

ii) automatically measuring by computer means the full width at half-height of a lipoprotein resonance line in said proton spectrum;

iii) storing by computer means a predetermined standard value for which abnormal full widths indicate the presence of cancer;

vi) automatically classifying by computer means the full width measured in step (ii) into a category of normal full widths or into a category of abnormal full widths as compared to the predetermined standard;

v) measuring the triglyceride level of the bodily fluid sample utilized when the bodily fluid sample is classified as having abnormal full widths in step (iv);

vi) classifying the triglyceride level measured into a category of normal levels or above normal levels;

vii) automatically generating a C-13 nuclear magnetic resonance spectrum from the bodily fluid sample utilized when said bodily fluid sample is classified in step (vi) as having above normal levels of triglycerides;

viii) automatically classifying by computer means the C-13 nuclear magnetic spectrum into a category of normal or abnormal spectrum, for which an abnormal spectrum indicates the presence of cancer; and ix) automatically reporting a diagnosis.

* * * * *